US007955982B2

(12) United States Patent
Katoh et al.

(10) Patent No.: US 7,955,982 B2
(45) Date of Patent: Jun. 7, 2011

(54) METHOD FOR SMOOTHING WAFER SURFACE AND APPARATUS USED THEREFOR

(75) Inventors: Takeo Katoh, Tokyo (JP); Tomohiro Hashii, Tokyo (JP); Katsuhiko Murayama, Tokyo (JP); Sakae Koyata, Tokyo (JP); Kazushige Takaishi, Tokyo (JP)

(73) Assignee: Sumco Corporation, Tokyo (JP)

( * ) Notice: Subject to any disclaimer, the term of this patent is extended or adjusted under 35 U.S.C. 154(b) by 315 days.

(21) Appl. No.: 12/161,070

(22) PCT Filed: Jan. 17, 2007

(86) PCT No.: PCT/JP2007/050582
§ 371 (c)(1),
(2), (4) Date: Jul. 16, 2008

(87) PCT Pub. No.: WO2007/083656
PCT Pub. Date: Jul. 26, 2007

(65) Prior Publication Data
US 2010/0151597 A1 Jun. 17, 2010

(30) Foreign Application Priority Data
Jan. 20, 2006 (JP) ................................ 2006-012188
Jan. 10, 2007 (JP) ................................ 2007-002661

(51) Int. Cl.
*H01L 21/311* (2006.01)
(52) U.S. Cl. . 438/697; 438/695; 438/753; 257/E21.219; 257/E21.22
(58) Field of Classification Search .................. 438/785, 438/694, 695, 697, 748, FOR. 110, FOR. 114, 438/FOR. 115, 75; 257/E21.219, E21.22, E21.485
See application file for complete search history.

(56) References Cited

U.S. PATENT DOCUMENTS

| 5,291,415 | A | | 3/1994 | Zarowin et al. |
| 5,433,650 | A | * | 7/1995 | Winebarger ................... 451/6 |
| 5,968,239 | A | * | 10/1999 | Miyashita et al. ................ 106/3 |
| 6,096,233 | A | | 8/2000 | Taniyama et al. |
| 6,294,469 | B1 | | 9/2001 | Kulkarni et al. |
| 6,376,395 | B2 | | 4/2002 | Vasat et al. |
| 6,939,210 | B2 | * | 9/2005 | Polyak et al. ................... 451/60 |
| 2001/0001755 | A1 | | 5/2001 | Sandhu et al. |
| 2003/0109137 | A1 | | 6/2003 | Iwamoto et al. |
| 2003/0199229 | A1 | * | 10/2003 | Vereen et al. ................... 451/36 |

(Continued)

FOREIGN PATENT DOCUMENTS

JP 7-50234 A 2/1995

(Continued)

OTHER PUBLICATIONS

English language Abstract of JP 11-135464 A.

(Continued)

*Primary Examiner* — Matthew Smith
*Assistant Examiner* — Quovaunda Jefferson
(74) *Attorney, Agent, or Firm* — Greenblum & Bernstein, P.L.C.

(57) ABSTRACT

Disclosed is a method for smoothing the surface of at least one side of a wafer which is obtained by slicing a semiconductor ingot. In this method, a fluid is applied according to projections of the wafer surface, thereby reducing the projections. Alternatively, a fluid is applied over the wafer surface, thereby smoothing the entire surface of the wafer while reducing the projections in the wafer surface.

7 Claims, 6 Drawing Sheets

U.S. PATENT DOCUMENTS

| | | |
|---|---|---|
| 2005/0133156 A1 | 6/2005 | Kim |
| 2008/0214094 A1* | 9/2008 | Katoh et al. .................. 451/41 |
| 2009/0004876 A1* | 1/2009 | Koyata et al. ................ 438/753 |

FOREIGN PATENT DOCUMENTS

| | | |
|---|---|---|
| JP | 10-154701 A | 6/1998 |
| JP | 11-135464 A | 5/1999 |
| JP | 2002-134466 A | 5/2002 |
| TW | 396449 | 7/2000 |
| WO | 00/72367 | 11/2000 |

OTHER PUBLICATIONS

Taiwan Office action, dated Feb. 1, 2011 along with an english translation thereof.

* cited by examiner

OSCILLATING NOZZLE FIXATION TEST:   FORM PREDICTION OF NOZZLE MOVEMENT RECIPE

+135 to +30 mm

OSCILLATING NOZZLE FIXATION TEST:   FORM PREDICTION OF NOZZLE MOVEMENT RECIPE

+30 to 0 mm

+135 to +30 mm

+30 to 0 mm

# METHOD FOR SMOOTHING WAFER SURFACE AND APPARATUS USED THEREFOR

TECHNICAL FIELD

The present invention relates to a method for smoothing a wafer surface and an apparatus used therefor.

Priority is claimed on Japanese Patent Application No. 2006-012188, filed Jan. 20, 2006 and Japanese Patent Application No. 2007-002661, filed Jan. 10, 2007, the content of which is incorporated herein by reference.

BACKGROUND ART

A conventional method for manufacturing a semiconductor wafer includes a slice process for slicing a semiconductor ingot to obtain a wafer, a lapping process for removing a surface flaw and irregularity caused by the slice by lapping a sliced wafer surface or a grinding process for performing one-sided grinding or double-sided grinding to improve flatness, an etching process for etching the wafer by dipping the wafer in acid or alkali so as to remove a processing distortion layer (or processing damage layer) of the wafer surface flattened in the process, and a minor polishing process for polishing the etched wafer.

However, the following problems occur in the processes of the conventional manufacturing method as described above.

Surface grinding used in the grinding or lapping process is advantageous to improve the flatness. However, a subsequent process should eliminate processing distortion since the processing distortion layer increases. Since an increased etching amount is required, the process is time-consuming and therefore productivity is low.

A technique similar to these techniques is disclosed in Japanese Unexamined Patent Application, First Publication No. H11-135464 (Patent Document 1).

DISCLOSURE OF THE INVENTION

Problem that the Invention is to Solve

However, it is difficult to control the surface shape of a wafer without the use of lapping, double-sided grinding, or one-sided grinding of the wafer. Moreover, it is difficult to control the surface shape of the wafer even when the above-described spin etching is used.

That is, a processing method is required to control thickness distribution, irregularity distribution, or processing distortion layer distribution such that the planarity, flatness, thickness uniformity or surface state of the wafer just after the slice is made at a trouble-free level in a device process serving as a subsequent process.

However, this processing method is not known. For example, the processing distortion layer is caused due to a mechanical process in lapping and grinding, but the wafer surface may not be processed without causing this processing distortion layer.

For example, only partial projections can not be processed in lapping and grinding, resulting in bad efficiency. The processing distortion layer may occur in the whole area of the wafer.

In immersion type etching, it is impossible to control the shape by controlling the machining allowance within a wafer plane such that only the projections are processed within the wafer plane, and the surface state of the flatness or the like is worse than that of the previous lapping or grinding process, and is very difficult to be improved.

According to paragraph [0009] described in the specification of Patent Document 1 in terms of the above-described spin etching, "It is difficult to uniformly set an etching rate across the whole area by regulating a supply amount of an etching liquid and a movement rate of an injection nozzle when the whole of one side of the wafer is etched at once by horizontally moving the injection nozzle across the whole diameter of the wafer." Substantially, as described in paragraph [0010], the whole area of the wafer is only uniformly etched by supplying the etching liquid from a "periphery portion 31" and a "central portion 32". The idea of controlling the machining allowance distribution within the wafer plane is neither described nor suggested. According to paragraph [0015], "a process for removing the processing distortion layer is performed with higher precision without breaking the flatness in comparison with immersion type acid etching". An active attempt of improvement of the planarity, flatness, thickness uniformity and surface state in this spin etching is not described.

The present invention has been made in view of the forgoing situation, and objects of the invention are as follows.

1. By reducing the occurrence of a processing distortion layer or reducing the machining allowance processing a wafer without causing the processing distortion layer, to reduce the wafer manufacturing cost by increasing the number of wafers to be sliced from a semiconductor ingot.

2. To control the machining allowance within a wafer plane by applying a fluid in correspondence with a projection surface state within the wafer plane and improve the planarity, flatness, thickness uniformity and surface state.

Means for Solving the Problem

According to a wafer surface smoothing method of a first aspect of the present invention, there is provided a method for smoothing the surface of at least one side of a wafer obtained by slicing a semiconductor ingot, including:

applying a fluid according to projections of the wafer surface, thereby reducing the projections.

According to a wafer surface smoothing method of a second aspect of the present invention, there is provided a method for smoothing the surface of at least one side of a wafer obtained by slicing a semiconductor ingot, including:

applying a fluid according to projections of the wafer surface, thereby smoothing the entire surface of the wafer while reducing the projections of the wafer surface.

According to a wafer surface smoothing method of a third aspect of the present invention, there is provided a method for smoothing the surface of at least one side of a wafer obtained by slicing a semiconductor ingot, including:

applying a fluid according to irregularities of the wafer surface, thereby smoothing the wafer surface.

According to a wafer surface smoothing apparatus of a fourth aspect of the present invention, there is provided an apparatus for smoothing the surface of at least one side of a wafer obtained by slicing a semiconductor ingot, including:

a detection means for detecting projections of the wafer surface, and a supply means for supplying a fluid over the wafer surface according to the detection, thereby reducing the projections.

ADVANTAGE OF THE INVENTION

According to the present invention, a wafer surface can be smoothed by controlling the application of a fluid over the wafer surface according to projections of the surface.

DESCRIPTION OF REFERENCE NUMERALS AND SIGNS

1: SINGLE WAFER ETCHING APPARATUS
10: WAFER ROTATION MEANS
20: ETCHING LIQUID SUPPLY MEANS
30: INJECTION CONTROL MEANS
W: WAFER

BEST MODE FOR CARRYING OUT THE INVENTION

Hereinafter, a first embodiment of a smoothing method and an apparatus used therefor according to the present invention will be described with reference to the accompanying drawings.

Figure 1:
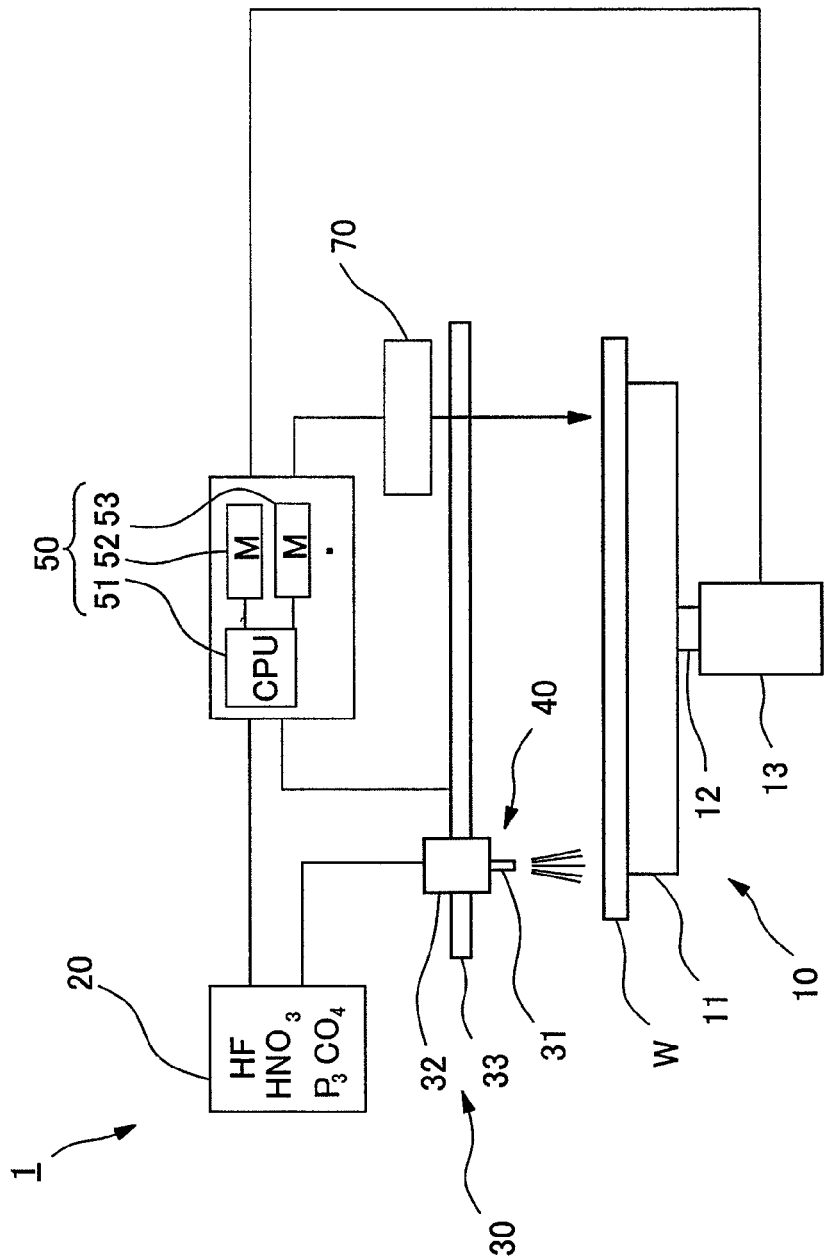
FIG. 1 is a schematic front view showing an embodiment of a single wafer etching apparatus according to the present invention.

FIG. 1 is a schematic front view showing a smoothing apparatus according to this embodiment. In the drawing, reference numeral 1 denotes a single wafer etching apparatus configuring the smoothing apparatus.

In this embodiment, the single wafer etching apparatus 1 has a stage 11 for supporting a wafer W and a rotary drive source 13 connected to the stage 11 by a rotation axis 12 such as a motor for rotating and driving the stage 11 through the rotation axis 12 or the like, and these configure a wafer rotation means.

Moreover, the single wafer etching apparatus 1 has an etching liquid supply means 20 for supplying an etching liquid, a nozzle 31 for injecting the etching liquid into the wafer W by supplying the etching liquid from the etching liquid supply means 20, a nozzle base portion 32 for supporting the nozzle 31 to be movable, and a guide portion 33 for regulating the position and movement of the nozzle base portion 32, and these configure a nozzle position control means 30. In the nozzle base portion 32, a mechanism for adjusting an angle of the nozzle 31 with respect to the nozzle base portion 32, a mechanism for adjusting a height position from the wafer W at a leading end of the nozzle 31, and a mechanism for switching the injection and non-injection of the etching liquid from the nozzle 31 are provided, and these configure an injection state control means 40.

Moreover, the single wafer etching apparatus 1 has a control portion 50 for setting the number of rotations of the wafer by controlling the number of rotations of the rotary drive source 13, regulating a supply state of the etching liquid by controlling the etching liquid supply means 20, and setting a state and position of the nozzle 31 by controlling the nozzle position control means 30 and the injection state control means 40. The control portion 50 has a computing portion 51 of a central processing unit (CPU) or the like and a plurality of memories 52, 53 . . . . Reference numeral 70 denotes a wafer surface detection means for measuring irregularities of the wafer surface using laser reflection of the wafer surface in a laser reflection method. The detection means 70 may be served as an independent apparatus and not be installed in the single wafer etching apparatus 1, and may measure the irregularities of the wafer surface.

The etching liquid supply means 20 supplies an acid etching liquid to the nozzle 31. Specifically, it is preferable to supply HF, $HNO_3$, $H_3PO_4$, or the like when a silicon wafer W is processed. Herein, HF and $HNO_3$ are used to etch the surface by silicon surface oxidization and oxide silicon dissolving and $H_3PO_4$ is used to control the viscosity mainly in the etching liquid. The etching liquid supply means 20 may supply the acids to the nozzle 31 by mixing the acids at a predetermined mixture ratio, and may supply the acids by separately supplying the acids to the nozzle 31 and mixing the acids around the nozzle 31.

The nozzle position control means 30 supports the nozzle base portion 32 such that the guide portion 33 for regulating the movement of the nozzle base portion 32 can move the nozzle 31 in a radial direction of the wafer W through the rotation center of the wafer W. The guide portion 33 can be configured such that the nozzle base portion 32 is movable in its longitudinal direction. A position of the nozzle 31 to the wafer W rotation center can be set by position movement in the longitudinal direction of the guide portion 33 of the nozzle base portion 32. The nozzle base portion 32 has a mechanism movable in its longitudinal direction to the guide portion 33.

In the guide portion 33, one end is provided to pass through the rotation center of the wafer W and the other end is supported to be rotatable in a horizontal direction. The nozzle 31 can be configured to be movable in a direction toward the wafer W by moving the guide member 33 in the horizontal direction.

The injection state control means 40 is installed in the nozzle base portion 32 and has an angle adjustment means for adjusting an angle of the nozzle 31 to the nozzle base portion 32, a height adjustment means for adjusting a height position from the wafer W at a leading end of the nozzle 31, and a valve disc for switching the injection and non-injection of the etching liquid from the nozzle 31. The supply from the etching liquid supply means 20 can be switched without providing the valve disc.

The control means 50 at least stores a surface irregularity shape of the wafer W before processing, stores a position of the nozzle 31 and an etching state, stores an amount of injection of the etching liquid and an etching state, and stores a shape of the wafer W serving as the basis after processing with the memories 52, 53 . . . , and has the computing portion 51 for computing these to compute the movement and etching liquid injection state of the nozzle 31. The memory 52 detects the surface state of the wafer W before processing using the detection means 70 and keeps the detection data. The memory data may be kept detecting the surface state of each wafer to be processed by the detection mean or detecting the surface state for each certain number of wafers by the detection means. Furthermore, data may be stored detecting projections of the wafer in each ingot or data which is defined for each type of wafer may be used.

When a process for smoothing the wafer is performed in the single wafer etching apparatus 1 of this embodiment, irregularities on the surface are measured using the detection means 70 by dividing the surface of the same wafer W into a plurality of regions. Detection data is input to the control means 50 for the shape of the wafer W and is stored in the memory 52.

Next, the stage 11 supports the wafer W and the rotary drive source 13 rotates and drives the stage 11 in a state controlled by the control means 50.

The control means 50 controls the supply of the etching liquid having a predetermined composition from the etching liquid supply means 20 to the nozzle 31 while the nozzle position control means 30 and the injection state control means 40 are controlled so that the etching liquid can be injected into the wafer W in a state in which a state, position, and injection time of the nozzle 31 are controlled.

When etching is applied in a predetermined state, the supply of the etching liquid from the etching liquid supply means 20 is stopped and the etching liquid on the surface of the wafer W is cleaned by supplying a rinse agent such as purified water or the like. Then, if needed, the wafer W is reversed and the same etching is applied to the backside.

Herein, a method for controlling the machining allowance in the wafer W in this embodiment will be described in detail.

The control means 50 keeps data by measuring in advance an etching amount in a unit time when a predetermined flow volume of an etching liquid is discharged from the nozzle 31 and measuring in advance data of an etching amount varying with a temperature of the wafer, an etching liquid temperature or an etching liquid composition. Next, a flow rate and a flow volume of the etching liquid for each region of the wafer W are set from the data of the memory 51 and the etching amount of the wafer W measured in advance. Accordingly, the control means 50 controls an injection state of the movement of the nozzle 31 or the like, an etching liquid viscosity and an etching reaction condition based on machining allowance setting values within the plane of the wafer W.

According to single wafer etching in this embodiment, a wafer W capable of being obtained by slicing a semiconductor ingot is rotated and an etching liquid is injected from the nozzle 31 to the surface of the wafer W in this rotation state in a state in which basic conditions of temperature, viscosity and composition of the etching liquid are controlled. Simultaneously, a flow rate and a flow volume of the etching liquid can be controlled within the plane of the surface of the wafer W by controlling processing parameters representing the position of the nozzle 31 and the number of wafer rotations. The surface of the wafer W can be smoothed by exactly controlling the machining allowance to projections in the wafer W surface.

The wafer surface can be smoothed without performing mechanical grinding such as lapping and grinding (of one side or both sides), thereby preventing a defect occurring in the lapping and grinding processes, specifically a processing distortion layer and an increase in the machining allowance in wafer processing due thereto.

Etching in this embodiment uses a liquid, but a gas is available. The etching amount is determined by measuring the wafer surface shape of each wafer. Alternatively, the etching amount can be determined for each same ingot and for each same slice process. When a characteristic of the surface shape is defined from that of a slice machine or ingot, data of a predetermined etching amount can be constructed and used for each wafer. In addition, data is created in various conditions, such that the created data can be directly appropriately used and can be corrected by coupling characteristics of the wafer.

Next, the etching state for an actual wafer will be described.

Figure 2:
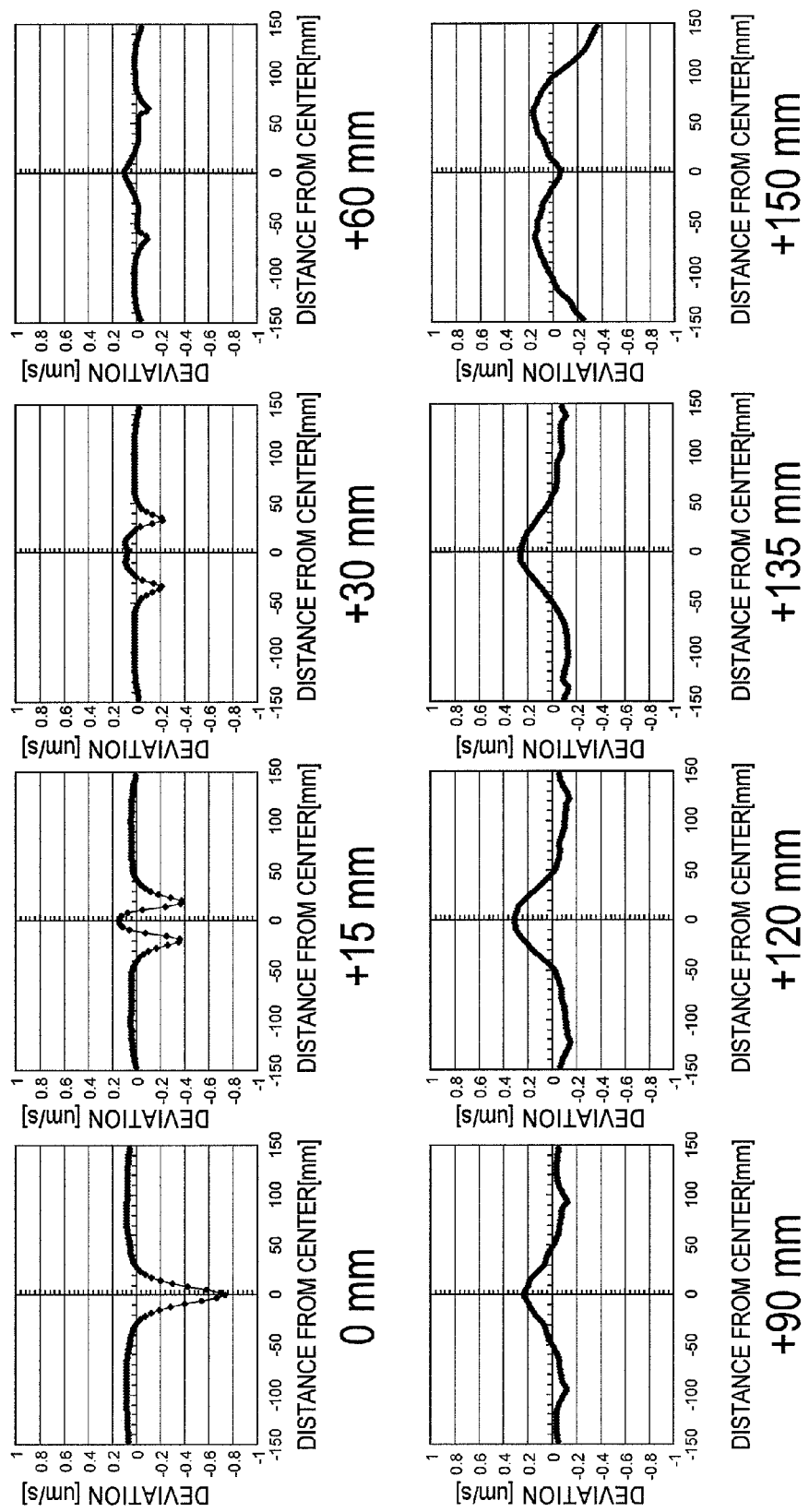
FIG. 2 is graphs showing machining allowance results obtained by changing nozzle position when the number of wafer rotations is 600 rpm.

FIG. 2 shows machining allowances of the whole wafer when the nozzle position is changed to 0 mm, 15 mm, 30 mm, 60 mm, 90 mm, 120 mm, 135 mm, and 150 mm from the wafer center in the number of wafer rotations of 600 win in a 300 mm silicon wafer and an etching liquid is injected during only 1 sec at these points.

At this time, a mixture liquid of $HF:HNO_3: H_3PO_4$ was used for the etching liquid.

Figure 3:
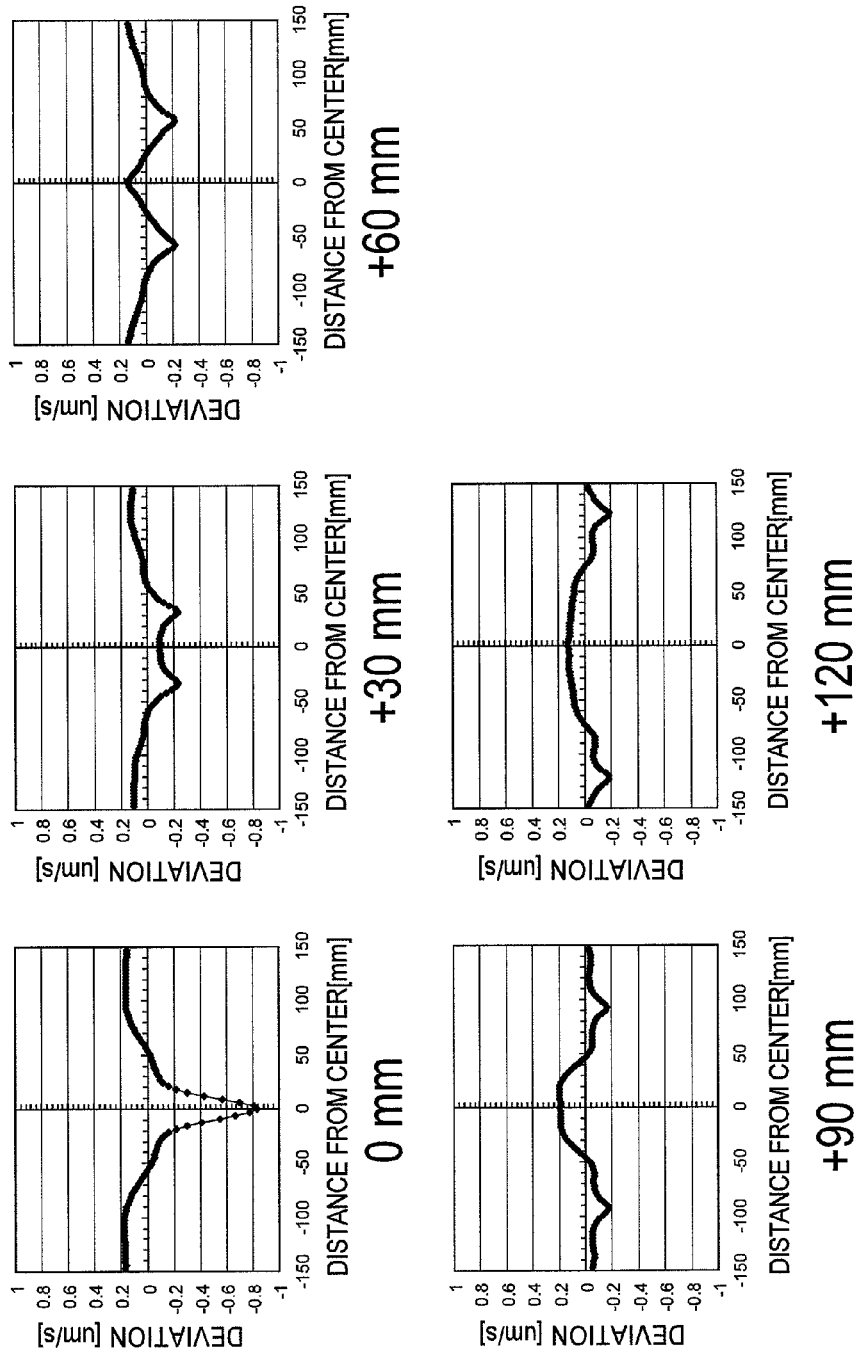
FIG. 3 is graphs showing machining allowance results obtained by changing nozzle position when the number of wafer rotations is 100 rpm.

In FIG. 3, the nozzle position is changed as shown in FIG. 2, but the number of wafer rotations is 100 rpm.

Figure 4:
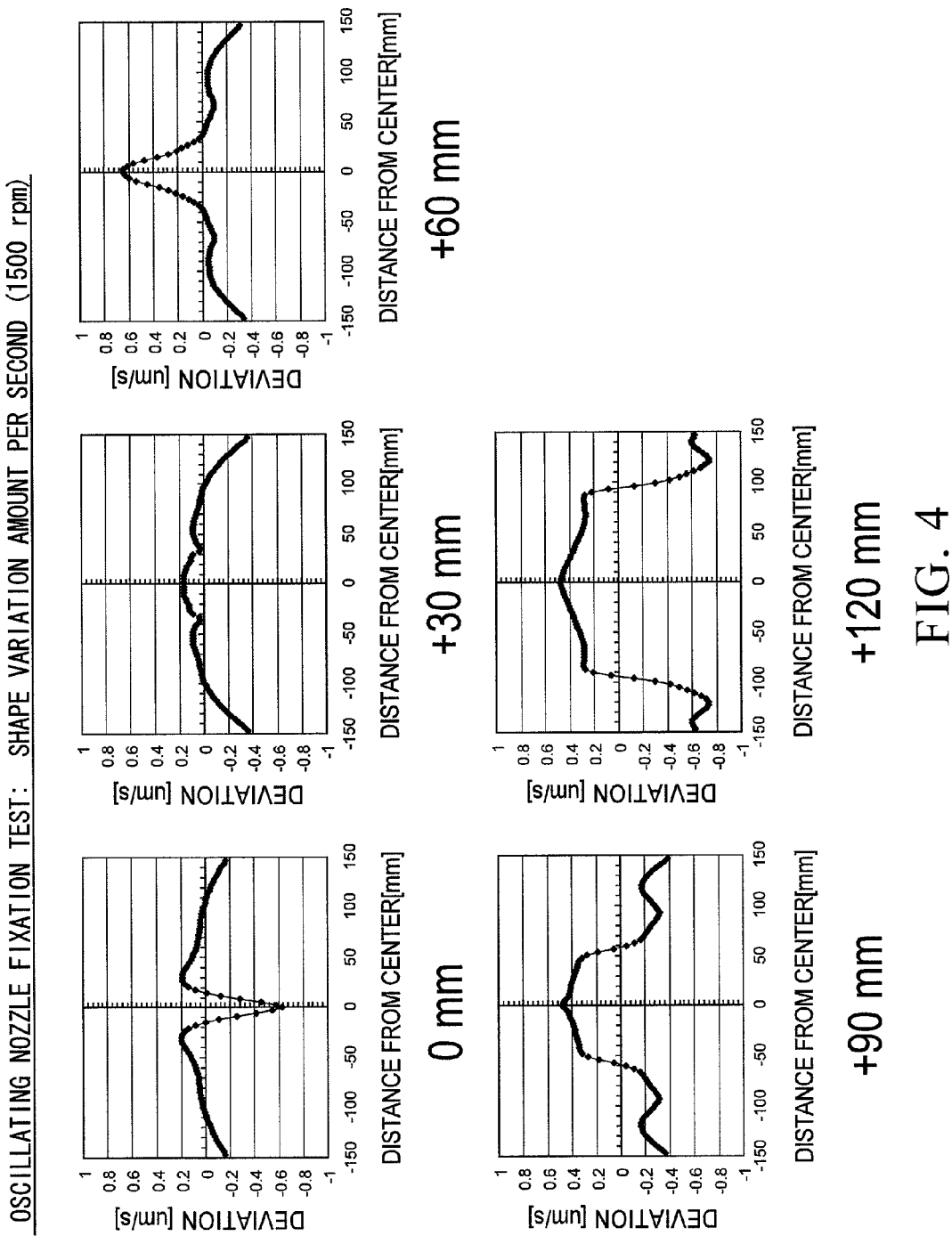
FIG. 4 is graphs showing machining allowance results obtained by changing nozzle position when the number of wafer rotations is 1500 rpm.

In FIG. 4, the nozzle position is changed as shown in FIG. 2, but the number of wafer rotations is 1500 rpm.

From these results, the machining allowance in the center increases when the nozzle 31 is in the central position of the wafer W, but the machining allowance is not large in other positions. It can be seen that the machining allowance increases in the injection position of the etching liquid as the nozzle moves to an outer side of the wafer.

It can be seen that the machining allowance deviation measurably increases when the number of rotations increases in a variation of the number of wafer rotations.

From these results, the machining allowance in a region where the nozzle 31 is located in the vicinity of the central position of the wafer W increases more than those in other regions. As the nozzle moves to an outer side of the wafer, the machining allowance of an inner side is smaller than that of the injection position of the etching liquid. This trend is remarkable as the number of wafer rotations increases. It can be taken into account that the centrifugal force in which the etching liquid flows into an outer side increases when the number of rotations increases, whereas the etching liquid does not sufficiently flow into the wafer.

Accordingly, the machining allowance can be set in a region of a ring shape (or doughnut shape) divided in a diameter direction of the wafer by changing the nozzle position in the wafer diameter direction.

Figure 5A:
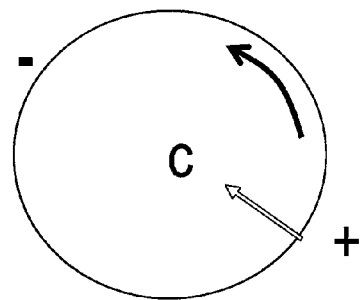
FIG. 5A is a plan view showing a movement locus of a nozzle and a locus from a position of 135 mm to a position of 30 mm, from the center.
Figure 5B:
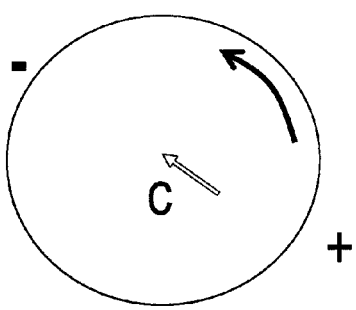
FIG. 5B is a plan view showing a movement locus of a nozzle and a locus from a position of 30 mm to 0 mm (center), from the center.
Figure 6A:
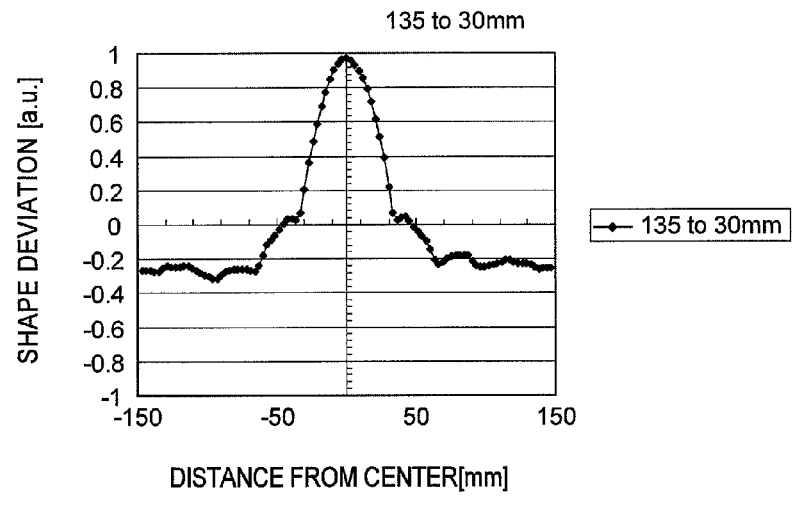
FIG. 6A is a graph showing wafer etching allowance distribution in the case of nozzle movement of FIG. 5A.
Figure 6B:
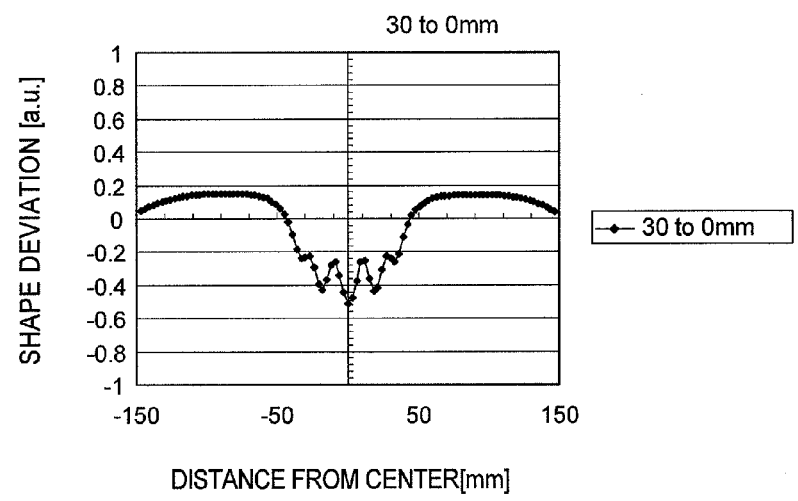
FIG. 6B is a graph showing wafer etching allowance distribution in the case of nozzle movement of FIG. 5B.

FIGS. 5A, 5B, 6A, and 6B show etching allowances in the whole area of the wafer when the nozzle moves in the case where the nozzle position is in respective points as shown in FIG. 2. FIG. 6A shows an etching allowance state when the nozzle moves from a position of 135 mm from the wafer center to a position of 30 mm from the center as shown in FIG. 5A. FIG. 6B shows an etching allowance state when the nozzle moves from a position of 30 mm from the wafer center to a position of 0 mm (center) as shown in FIG. 5B. At this time, the movement speed of the nozzle is 1 mm/sec with respect to the wafer center.

Accordingly, the machining allowance of the entire wafer can be set from data of each nozzle position as shown in FIG. 2.

INDUSTRIAL APPLICABILITY

According to the present invention, a wafer surface can be smoothed by controlling the application of a fluid over the wafer surface according to projections of the surface.

The invention claimed is:

1. A method for smoothing a surface of at least one side of a wafer obtained by slicing a semiconductor ingot, comprising:

measuring irregularities on the wafer surface of the wafer and storing data of the measured irregularities;

measuring in advance an etching amount in a unit time with predetermined flow volume of an etching liquid discharged from a nozzle and keeping the etching amount data; and applying a fluid from a nozzle to an upwardly-facing surface of the wafer while rotating the wafer around a center axis of the wafer, wherein the application of the liquid over the wafer surface is controlled by controlling at least one of a rotation state of the wafer, a composition of the fluid, a viscosity of the fluid, a radial position of an injector nozzle relative to the wafer, an angle of the injector nozzle relative to the wafer, a height of the injector nozzle relative to the wafer, an injection state of the fluid, a movement state of the injection position, and an injection time of the fluid, based on the data of the measured irregularities and the etching amount data, in said applying a fluid.

2. The method for smoothing the surface of at least one side of a wafer obtained by slicing a semiconductor ingot according to claim 1, further comprising:
   detecting projections of the wafer surface, wherein said applying a fluid is performed according to the detection; and
   reducing the projections.

3. The wafer surface smoothing method according to claim 2, wherein the projections are detected for each wafer.

4. The wafer surface smoothing method according to claim 2, wherein the projections are detected for each predetermined number of wafers.

5. The wafer surface smoothing method according to claim 2, wherein the projections are detected using preset projection data.

6. The wafer surface smoothing method according to claim 1, wherein the wafer is smoothed and processed for each sheet.

7. The wafer surface smoothing method according to claim 1, wherein the fluid is an acid.

* * * * *